(12) United States Patent
Coriat et al.

(10) Patent No.: US 10,923,191 B2
(45) Date of Patent: Feb. 16, 2021

(54) 3D SRAM/ROM WITH SEVERAL SUPERIMPOSED LAYERS AND RECONFIGURABLE BY TRANSISTOR REAR BIASING

(71) Applicant: COMMISSARIAT A L'ENERGIE ATOMIQUE ET AUX ENERGIES ALTERNATIVES, Paris (FR)

(72) Inventors: David Coriat, Grenoble (FR); Adam Makosiej, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/510,263

(22) Filed: Jul. 12, 2019

(65) Prior Publication Data
US 2020/0035302 A1  Jan. 30, 2020

(30) Foreign Application Priority Data

Jul. 13, 2018 (FR) ..................... 18 56514

(51) Int. Cl.
| | | |
|---|---|---|
| *G11C 11/412* | (2006.01) | |
| *G11C 14/00* | (2006.01) | |
| *G11C 11/417* | (2006.01) | |
| *G11C 11/418* | (2006.01) | |
| *G11C 17/08* | (2006.01) | |

(Continued)

(52) U.S. Cl.
CPC ........ *G11C 14/0054* (2013.01); *G11C 11/412* (2013.01); *G11C 11/417* (2013.01); *G11C 11/418* (2013.01); *G11C 17/08* (2013.01); *H01L 23/528* (2013.01); *H01L 23/5226* (2013.01);

(Continued)

(58) Field of Classification Search
CPC . G11C 14/0054; G11C 11/412; G11C 11/417; G11C 11/418; G11C 17/08; H01L 23/5226

See application file for complete search history.

(56) References Cited

U.S. PATENT DOCUMENTS 5,040,143 A * 8/1991 Matsumura ............... G11C 5/14
365/51
5,365,475 A 11/1994 Matsumura et al.
(Continued)

FOREIGN PATENT DOCUMENTS

| EP | 1 939 888 A1 | 7/2008 | |
|---|---|---|---|
| EP | 1939888 A1 * | 7/2008 | ........... G11C 11/412 |

(Continued)

OTHER PUBLICATIONS

French Preliminary Search Report dated Jun. 12, 2019 in French Application 18 56514 filed on Jul. 13, 2018 (with English Translation of Categories of Cited Documents).

(Continued)

*Primary Examiner* — Mushfique Siddique
(74) *Attorney, Agent, or Firm* — Oblon, McClelland, Maier & Neustadt, L.L.P.

(57) ABSTRACT

A 3D microelectronic device is provided with several superimposed layers of components, with an upper layer including one or several memory cells having a SRAM structure and provided with a rear biasing electrode. The biasing of the rear biasing electrode is modified to switch the memory cells from a ROM operating mode to a SRAM operating mode.

11 Claims, 6 Drawing Sheets

(51) Int. Cl.
*H01L 23/522* (2006.01)
*H01L 23/528* (2006.01)
*H01L 27/06* (2006.01)
*H01L 27/11* (2006.01)
*H01L 27/112* (2006.01)

(52) U.S. Cl.
CPC ...... *H01L 27/0688* (2013.01); *H01L 27/1104* (2013.01); *H01L 27/11213* (2013.01)

(56) References Cited

U.S. PATENT DOCUMENTS

| | | | | |
|---|---|---|---|---|
| 5,517,038 | A | * | 5/1996 | Maeda ................ G11C 11/419 257/69 |
| 8,995,178 | B1 | * | 3/2015 | Yang ................... G11C 11/412 365/156 |
| 9,817,601 | B1 | * | 11/2017 | Zhang .................. G06F 3/0673 |
| 2008/0175039 | A1 | | 7/2008 | Thomas et al. |
| 2009/0294861 | A1 | | 12/2009 | Thomas et al. |
| 2018/0277197 | A1 | * | 9/2018 | Noel .................... G11C 11/412 |
| 2019/0312039 | A1 | * | 10/2019 | Andrieu ............... G11C 11/419 |
| 2020/0020373 | A1 | * | 1/2020 | Makosiej ................ G11C 7/20 |

FOREIGN PATENT DOCUMENTS

| | | |
|---|---|---|
| EP | 2 131 396 A1 | 12/2009 |
| EP | 2131396 A1 * | 12/2009 .......... H01L 27/1104 |

OTHER PUBLICATIONS

Dongsoo Lee et al., "Area Efficient ROM-Embedded SRAM Cache", IEEE Transactions on Very Large Scale Integration (VLSI) Systems, vol. 21, No. 9, Sep. 2013, 13 pages.

* cited by examiner

3D SRAM/ROM WITH SEVERAL SUPERIMPOSED LAYERS AND RECONFIGURABLE BY TRANSISTOR REAR BIASING

TECHNICAL FIELD AND PRIOR ART

The invention relates to the field of Static Random Access Memories (SRAM), and more specifically relates to that of memories, provided with cells having a SRAM structure, and also likely to integrate a Read-Only Memory (ROM) function.

In this field, document U.S. Pat. No. 5,365,475 presents a memory cell having a SRAM structure with 6 transistors likely, using an additional supply line and an additional ground line, to be used, via a fixed biasing of the transistors thereof, as a ROM memory cell. The behaviour in conventional ROM or SRAM mode of the cell is fixed, during the manufacture of the memory, by choosing the manner in which same is connected to the supply lines and ground lines.

Moreover, in order to perform the start-up thereof, a digital system uses data that are typically stored in a space of a ROM memory. Once said start-up has been performed, during the operation of the system, said ROM memory space is generally unused.

The document "Area Efficient ROM-Embedded SRAM Cache", by Dongsoo Lee et al., IEEE Transactions on VLSI systems, vol. 21, no. 9, 2013 presents a memory formed from SRAM cells suitable for operating according to a conventional SRAM memory mode during which the cells are available for read and write access, and also may adopt another operating mode during which same are read-only. The change from one mode to the other is achieved using an additional word line of which the biasing is modified. Said additional word line requires a substantial modification of the control circuits external to the matrix of cells, and in particular of the controller of word lines and of the associated control logic.

Generally, in the field of microelectronics and in particular that of memories, it is continually sought to increase the transistor density.

Therefore the problem arises of creating an improved memory device that is advantageously provided with a ROM memory functionality and which is improved with respect to the disadvantages mentioned hereinabove, in particular which is reconfigurable or reusable, with an improved integration density, and which does not require a substantial modification of external control circuits.

DISCLOSURE OF THE INVENTION

According to an embodiment, a microelectronic device is provided with several superimposed layers of components and comprising:
- a lower level provided with one or several electronic components formed in at least one first semiconductive layer,
- an upper layer comprising transistors having respective channel regions formed in at least one second semiconductor layer arranged above the first semiconductive layer, the device comprising:
  - a set of memory cells each provided with a first inverter and a second inverter cross-connected, the first inverter and the second inverter being connected to and arranged between a supply line and a ground line, the first inverter and the second inverter respectively comprising at least one first transistor of a first type, N or P, and at least one second transistor of said first type N or P, belonging to said upper layer and each having a lower electrode located between the second semiconductor layer and the first semiconductive layer and coupled by electrostatic coupling with a channel region located in the second semiconductor layer, said cells of said set being furthermore connected to:
- a first biasing line of one among the lower electrode of the first transistor and the lower electrode of the second transistor,
- a second biasing line of the other among the lower electrode of the first transistor and the lower electrode of the second transistor,
- the device further comprising a circuit configured for during an initialisation sequence:
  - during a first phase apply a first potential and a second potential different from the first potential, respectively on said first biasing line and said second biasing line, and apply a voltage between said supply line and the ground line, in such a way as to impose on each cell of said set a logical data of which the value depends on the biasing line among said biasing lines to which the lower electrode of its first transistor and the lower electrode of its second transistor are respectively connected,
  - then
  - during a second phase apply the same nominal potential on the first biasing line and the second biasing line, and maintain a voltage between said supply line and said ground line, in such a way as to retain this logical data and render the cells of said set available for read and write access.

The first potential and the second potential applied during the initialisation sequence are provided in such a way as to carry out an asymmetrical biasing between the first transistor and the second transistor and consequently imbalanced of an inverter with respect to the other of each cell of said set in order to impose on these cells pre-load data.

Without having to necessarily modify the internal line decoder of the memory and while still making it possible to increase the integration density, this circuit makes it possible to use said memory cells as ROM memory cells, then, to use these cells as conventionally operating SRAM memory cells.

Through the sequence of potentials applied during the first phase then during the second phase on the rear electrodes, the supply line, the ground line, the set of cells can be reconfigured automatically for the operating mode with a pre-loaded data during the initialisation to a conventional SRAM operating mode.

At the beginning of the programming sequence and of its first phase, the difference in potentials between the supply line and the ground line is advantageously maintained zero in order to erase the cell. During the first phase a powering up is then carried out and a difference in potentials between the supply line and the ground line is thus applied. During the second phase, a difference in potentials is maintained between the supply line and the ground line.

The value of the data pre-loaded into a cell of said set during the initialisation sequence depends on the way in which the cell is connected in relation to the biasing lines.

Thus, at least one first cell of said set can have a lower electrode of its first transistor which is connected to the first biasing line and a lower electrode of the second transistor which is connected to the second biasing line, while at least one second cell of said set has a lower electrode of its first transistor which is connected to the second biasing line and a lower electrode of its second transistor which is connected to the first biasing line, in such a way that during said initialisation sequence, a first logical data is imposed on the first cell, and a second logical data, complementary to the first data is imposed on the second cell.

Typically, the cells of said set respectively comprise at least one third transistor and at least one fourth transistor, with the third transistor and the fourth transistor being of a second type, P or N, opposite the first type, the third transistor and the fourth transistor belonging to said upper layer and each having a lower electrode located between the second semiconductor layer and the first semiconductive layer and coupled by electrostatic coupling with a channel region located in the second semiconductor layer. Thus, these lower electrodes of the third and fourth transistors can be used to increase the biasing imbalance between the transistors that is implemented during the initialisation sequence in order to impose a pre-load data to the cells of said set.

Advantageously, said cells of said set can be furthermore connected to:
at least one third biasing line of one among the lower electrode of the third transistor and the lower electrode of the fourth transistor,
at least one fourth biasing line of the other among the lower electrode of the third transistor and the lower electrode of the fourth transistor.

In this case, said circuit can be configured during said first phase of the initialisation sequence to:
apply a pair of different potentials, respectively on said third biasing line and said fourth biasing line, then
during the second phase apply the same nominal potential on the third biasing line and the fourth biasing line.

The first transistor and the second transistor can be:
respectively, a first load transistor and a second load transistor of the type P, or
respectively, a first conduction transistor and a second conduction transistor of the type N.

According to a possible embodiment, when the first transistor and the second transistor are respectively, a first load transistor and a second load transistor of the type P, the cells of said set can each be provided with a first conduction transistor having a gate connected to a gate of the first load transistor and with a second conduction transistor having a gate connected to a gate of the second load transistor, with the conduction transistors being provided with a lower electrode coupled by electrostatic coupling with a channel region. During the first phase of the initialisation sequence the lower electrodes respectively of said first conduction transistor and of said second conduction transistor can then be set to the same nominal potential VNBB or set respectively to a third potential and to a fourth potential.

According to another possible embodiment, when the first transistor and the second transistor are respectively, a first conduction transistor and a second conduction transistor of the type N, the cells of said set can each be provided with a first load transistor having a gate connected to a gate of the first conduction transistor and with a second load transistor having a gate connected to a gate of the second conduction transistor, with the conduction transistors being provided with a lower electrode coupled by electrostatic coupling with a channel region. The lower electrodes respectively of said first load transistor and of said second load transistor can be set during the first phase of the initialisation sequence: to the same nominal potential VPBB or respectively to a third potential and to a fourth potential.

The cells of said set can be furthermore provided with a first access transistor to the first node and with a second access transistor to the second node. Advantageously, the first access transistor and the second access transistor are each provided with a lower electrode located between the second semiconductor layer and the first semiconductive layer and coupled by electrostatic coupling with a channel region located in the second semiconductor layer.

In this case, the lower electrodes respectively of said first access transistor and of said second access transistor can be during the first phase of the initialisation sequence set to the same potential less than or equal to or be set respectively to the first potential and to the second potential when the first access transistor and the second access transistor are of the first type, or can be set respectively to the third potential and to the fourth potential when the first access transistor and the second access transistor are transistors of the second type, P or N opposite the first type.

Advantageously, said circuit can comprise: a switching element between a portion able to receive a power voltage VDD and the supply line, with the switching element being configured to alternatively disconnect then connect the portion to the supply line following a change of state in a first control signal.

According to another possible embodiment, said circuit can comprise: a portion receiving a power voltage VDD, at least one delay cell being arranged between said portion and said supply line.

The set of memory cells belongs to a memory device.

Advantageously, this memory device further comprises a module for converting a virtual memory address into a physical memory address. This conversion module can be provided with a decoder configured to: using a virtual address, produce an indicator signal of a first type of access memory with data pre-loaded in said cell set during said initialisation sequence or an indicator signal of a second type of access memory with data written in said cell set after said initialisation sequence and transmit this virtual address to a shifter module, with the shifter module being configured to apply a shift operation to a virtual address so as to produce a physical address.

BRIEF DESCRIPTION OF THE DRAWINGS

The present invention will be better understood upon reading the description of examples of embodiments given, purely for the purposes of information and in no way limiting, in reference to the accompanying drawings wherein.

Identical, similar or equivalent portions of different figures bear the same numerical references in order to facilitate passing from one figure to the other.

The various portions shown on the figures are not necessarily shown according to a uniform scale, in order to make the figures more legible.

DETAILED DISCLOSURE OF PARTICULAR EMBODIMENTS

Figure 1:
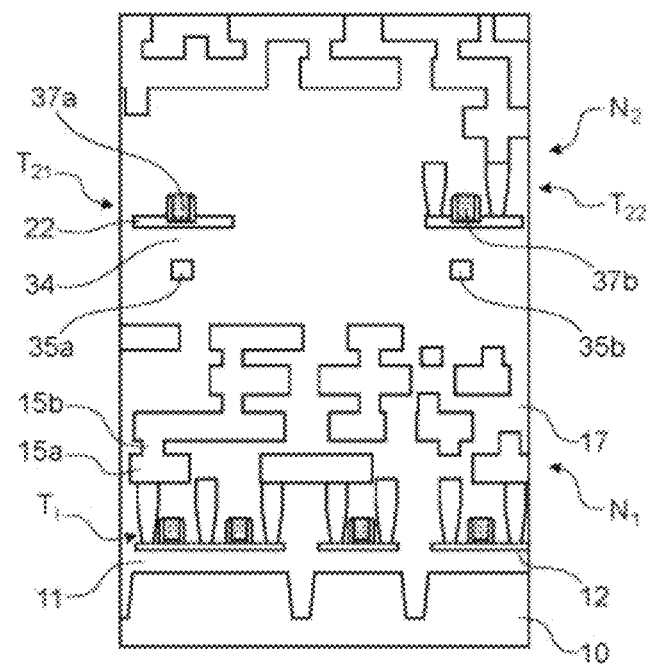
FIG. 1 is used to show an example of a particular arrangement of inverter transistors of a SRAM cell which is formed in an upper layer of a device with several superimposed levels of components, with the transistors being provided with separate rear biasing electrodes and which can be polarized independently of one another, and which make it possible, during an initialisation sequence, to impose a logical data on this cell according to a manner that differs from a conventional write operation.

Reference is now made to FIG. 1 showing an example of a particular arrangement of transistors $T_{21}$, $T_{22}$ in a memory cell belonging to a 3D microelectronic device implemented according to an embodiment of the present invention and comprising several superimposed layers of components and interconnections.

The transistors $T_{21}$, $T_{22}$ are in particular transistors respectively of a first inverter and of a second inverter forming a SRAM cell switch, typically transistors of type N called conduction (or "pull-up") transistors, or transistors of type P called load (or "pull-down") transistors.

The device is provided with a first level $N_1$ comprising a first semiconductive layer 12 wherein electronic components are at least partially arranged. In the example shown given in FIG. 1, these components are transistors of which the respective channel regions extend in the first semiconductive layer 12.

The first semiconductive layer 12 rests on a substrate that can be of the semiconductor on insulator type such as a substrate of the SOI type (Silicon On Insulator), advantageously according to a technology of a semiconductor on insulator that is fully depleted also called FDSOI (Fully Depleted Silicon On Insulator).

In this case, the first surface semiconductor layer 12 is arranged on an insulating layer 11 commonly referred to as BOX (for "Buried Oxide"), itself resting on a semiconductor support layer 10. The first level $N_1$ is here also provided with interconnection elements typically formed from a set of metal lines 15a and of vias 15b arranged in an insulating layer 17.

The device is provided with at least one second level $N_2$ arranged on the first level $N_1$ and comprising transistors, in particular the transistors $T_{21}$, $T_{22}$ of which the respective channel regions extend in at least one second semiconductor layer 22. The transistors $T_{21}$, $T_{22}$, are each provided with an upper gate electrode 37a, 37b arranged on the second semiconductor layer 22 and with a lower electrode 35a, 35b located under the second semiconductor layer 22, in other words between the second semiconductor layer 22 and the first semiconductive layer 12.

The lower electrode 35a, 35b is typically separated from the second semiconductor layer 22 by a layer of dielectric material 34. This dielectric layer 34 has a composition and a thickness provided in such a way as to allow for an electrostatic coupling also called capacitive coupling between the lower electrode 35 and the second semiconductor layer 22. Thus, the channel regions of the transistors $T_{21}$, $T_{22}$ are in this example also controlled from underneath, respectively by the intermediary of lower electrodes 35a, 35b which, according to the electrical potentials that are applied to them, can make it possible to modulate the threshold voltage $V_T$ of the transistors $T_{21}$, $T_{22}$.

The lower electrodes 35a, 35b are connected respectively to a first biasing line and to a second biasing line (not shown in FIG. 1). The biasing lines are typically in the form of metal lines led to convey biasing signals of the transistors $T_{21}$, $T_{22}$.

In the particular embodiment shown in FIG. 2 (where the transistors $PG_L$, $PU_R$, $PD_R$, $PD_L$, $PU_L$, $PG_L$ of a first SRAM cell $C_i$ with 6 transistors are diagrammatically represented by rectangular zones), these are conduction (pull-up) transistors $PU_L$, $PU_R$, of the SRAM cell that have a configuration of the type of that described hereinabove and are provided with rear biasing electrodes.

The transistors $PG_L$, $PU_R$, $PD_R$, $PD_L$, $PU_L$, $PG_L$ of the cell are located in an upper layer $N_k$, while a first biasing line BIL, and a second biasing line BIH, respectively connected to the rear electrodes 35a, 35b of the transistors $PU_L$, $PU_R$ are located in a lower level $N_{k-1}$. The connection between the rear electrodes 35a, 35b of the transistors $PU_L$, $PU_R$ and respectively a first biasing line BIL and a second biasing line BIH, is carried out by the intermediary of vias 21a, 21b.

The arrangement and the connection of the rear electrodes 35a, 35b of the transistors $PU_L$, $PU_R$ with respect to biasing lines BIL and BIH is for the first cell such that a first via 21a here connects the rear electrode 35a of the transistor $PU_L$ to the first biasing line BIL, while a second via 21b connects the rear electrode 35b of the transistor PUR to the second biasing line BIH. The two biasing lines BIL, BIH, are separate, in other words not connected together and can thus be controlled independently from one another through separate biasing signals and which can possibly be different from one another.

Such a configuration makes it possible to use the memory cell $C_i$ alternatively as a ROM memory cell and as that of a RAM memory cell.

The biasing lines BIL and BIH make it possible in particular to initialise the first cell $C_i$ and to impose outside its conventional SRAM operating mode, and in particular prior to this SRAM operating mode, a pre-load logical data. The value of this initialisation logical data depends on the signals applied on the biasing lines BIL and BIH and for a given pair of signals, in the manner of which the first cell $C_i$ is connected to the biasing lines BIL and BIH. The value of this logical data imposed during the aforementioned initialisation sequence can thus be determined right from the design of the device. The logical data imposed during the initialisation sequence thus forms a ROM memory data or data of a ROM code that can be determined during the design of the device.

Figure 2:
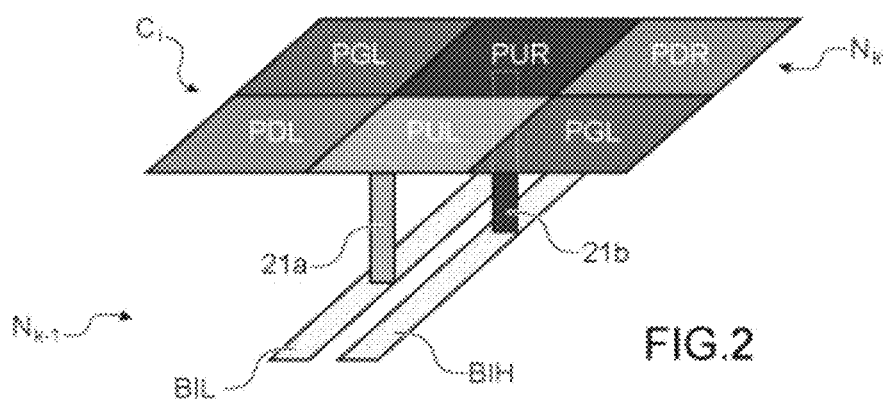
FIG. 2 is used to show an example of a particular arrangement of conductive biasing lines with regards to the rear electrodes of transistors of a first memory cell to impose on this first cell, during an initialisation sequence, a logical data referred to as "pre-load" of which the value depends on this arrangement.
Figure 3:
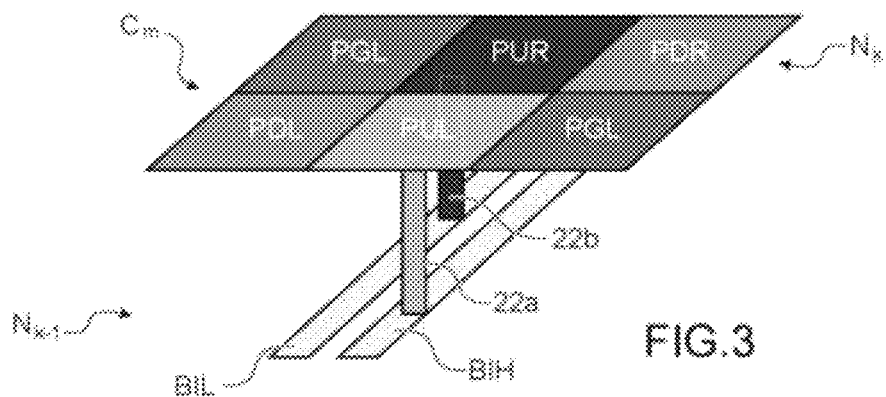
FIG. 3 is used to show an example of a different arrangement, in a second cell, of the conductive biasing lines with regards to the rear electrodes of transistors in order to impose on this second cell, during an initialisation sequence, a logical data that is complementary to that imposed on the first cell.

In FIG. 3, a second cell $C_m$ SRAM with 6 transistors belonging to the same set of cells, for example to the same row of cells as that of cell $C_i$ described hereinabove in connection with FIG. 2, is shown.

The cell $C_m$ is also connected to the biasing lines BIL and BIH which thus makes it possible to initialise this second first cell $C_m$, and to impose on it, during the aforementioned initialisation sequence, a logical data of a value complementary to that of the first cell.

The respective rear electrodes 35a, 35b of the transistors $PU_L$, $PU_R$ are therefore also controlled using the same biasing lines BIL, BIH. The connection between the rear electrodes 35a, 35b of the transistors $PU_L$, $PU_R$ and the biasing lines BIL, BIH, is also carried out by the intermediary of vias 22a, 22b of which the arrangement however differs from that provided for the first cell C.

Thus, for the second cell $C_m$, a via 22a this time connects the rear electrode 35a of the transistor $PU_L$ to the second biasing line BIH, while a second via 22b connects the rear electrode 35b of the transistor $PU_R$ to the first biasing line BIL.

Due to its different (inverse) connection of the rear electrodes 35a, 35b, with regards to biasing lines BIL and BIH, for the same set of signals applied on the biasing lines BIL and BIH, the second cell $C_m$ receives, on its respective rear electrodes 35a, 35b of the transistors $PU_L$, $PU_R$, a pair of signals inverse to that received by the first cell $C_i$. The value of the logical data imposed during the aforementioned initialisation sequence can thus be complementary to that imposed on the first cell $C_i$.

Figure 4:
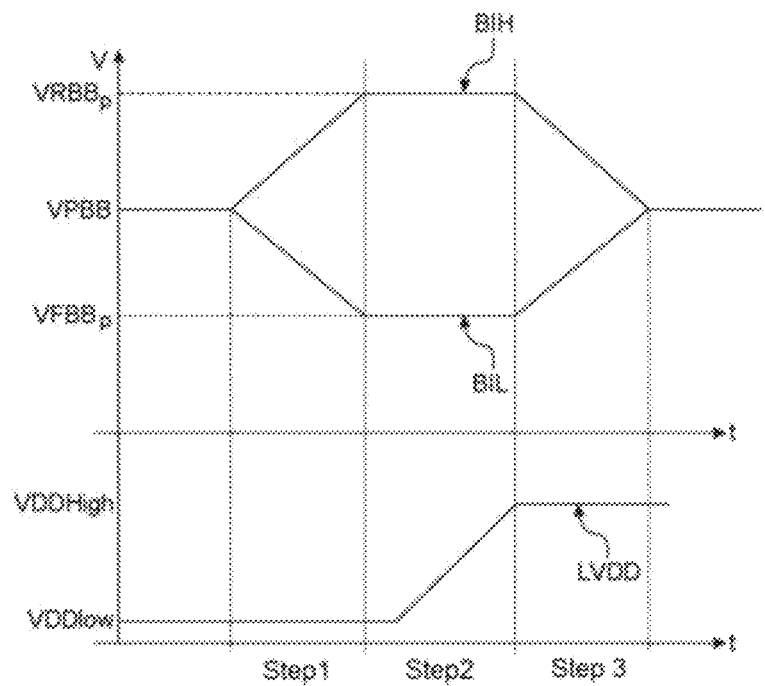
FIG. 4 gives an example of sequence of biasing and power signals able to be applied to the inverters of a SRAM cell in order to impose on it a pre-load logical data that depends on the way in which it is connected to the conductive biasing lines, then have it adopt a SRAM operating mode.

An example of a sequence of signals applied on the biasing lines BIL, BIH (not shown in FIG. 2) and making it possible to program the cells that are connected to them and to thus use, as mentioned hereinabove, these cells as cells of a ROM memory, is given in the chronogram of FIG. 4.

This figure also gives the change in the power voltage and in particular of the potential applied on a supply line LVDD of the inverters.

At the beginning of the initialisation sequence (time t0), the inverters of the cell do not receive any power voltage. In other words, the difference in potentials between a supply line LVDD connected for example to the load transistors of the cell and a ground line connected for example to the conduction transistors of the cell is maintained zero. For this, it can typically be provided to place the supply line LVDD at a potential VDDlow equal for example to the ground potential GND, while the ground line is also set to the same potential, for example to the potential GND. The first biasing line BIL and said second biasing line BIH are set to the same nominal potential, for example VNBB, at the beginning of the initialisation sequence. The nominal potential depends on the type of transistor N or P that is connected to the biasing lines BIL, BIH. In the case where the transistors are of the NMOS type a nominal potential VNBB is provided, for example chosen equal to the ground potential GND. In the case where the transistors are of the PMOS type a nominal potential VPBB is provided that can be different from VNBB.

During this first step, a data memorised in the cell is then destroyed or erased, with this erasing being carried out for all of the cells connected to the lines LVDD, LGND, with the nodes of all of them then having the same value.

A pair of potentials is then applied (step 1) respectively on said first biasing line BIL and said second biasing line BIH, in order to implement an imbalanced biasing of the load transistors $PU_L$, $PU_R$ in relation to one another. A first potential VBIL=VFBBp, is thus applied on the first biasing line BIL, while a second potential VBIH=VRBBp different from the first potential and in this example greater and which can be opposite the first potential, is applied on the second biasing line BIL. The application of this pair of opposite potentials VFBBp, VRBBp on the biasing lines BIL, BIH, drives an asymmetrical biasing, in other words imbalanced of the inverters. In this particular embodiment, this biasing imbalance is implemented in particular on the load transistors $PU_L$, $PU_R$ of type P.

The choice of the potentials VFBBp, VRBBp can depend on the variability of the method of manufacture from one cell to another in a cell array, on time variabilities. The choice of potentials VFBBp, VRBBp can also be dictated by a reliability criterion in particular of type 6σ (σ being a standard deviation, with the criterion corresponding approximately to 2 defective cells out of a billion).

A potential VDDhigh is then applied (step 2) on the supply line LVDD so as to render the difference in potentials non-zero between the supply line LVDD and the ground line LGND. This powering up added to the imbalanced biasing of the rear electrodes results on the memorisation nodes of the cell in the imposition of a logical data, of which the value depends on the way in which the cell is connected to the biasing lines BIL, BIH.

Thus, the application of a pair of potentials VFBBp, VRBBp makes it possible to impose a given logical state, for example a logic '1', to a node of a first cell. During this same initialisation sequence, another cell, which, through its different connection of the transistors $PU_L$, $PU_R$ respectively to the biasing lines BIH and BIL this time receives the inverse pair of potentials VRBBp, VFBBp, and is then imposed a complementary logical state, for example a logic '0' on this same node.

In other words, a given connection to the biasing lines BIL and BIH, for example for which the rear electrode of a first transistor $PU_L$, is connected to the biasing line BIH and for which the rear electrode of a second transistor $PU_R$ is connected to the biasing line BIL makes it possible to impose a complementary logical state, in relation to an alternative configuration wherein the rear electrode of the first transistor $PU_L$ is connected to the biasing line BIL and the rear electrode of the second transistor $PU_R$ is connected to the biasing line BIH.

Then (step 3), the same nominal potential (VNBB for transistors of type N, VPBB for transistors of type P) is established or re-established on the biasing lines BIL and BIH, which makes it possible to obtain or to re-establish a biasing balance or a biasing symmetry between the two load transistors $PU_L$, $PU_R$ of type P. The potentials applied make it possible to thus retain the programmed data and to render the cell available for read and write access.

During a first phase, the cell was thus initialised or programmed with a ROM memory data value or ROM code that depends on its connection to the biasing lines BIL and BIH, with this value '1' or '0' having typically been determined by the designer during the implementation of the device. Due to the biasing rebalancing between transistors $PU_L$ and $PU_R$ then implemented during a second phase of the initialisation sequence, this pre-loaded cell can then be reused and it can be made to operate as a conventional SRAM cell that is available for both read and write access.

As an alternative to the embodiment that has just been given, it can be provided to impose a pre-load value during the aforementioned initialisation sequence, by implementing this time a biasing imbalance between the two conduction transistors $PD_L$, $PD_R$.

It can also be provided to impose a pre-load value during the aforementioned initialisation sequence, by implementing a biasing imbalance between the two sides of the cell and carrying out in particular a biasing imbalance both between the two conduction transistors $PD_L$, $PD_R$ and the two load transistors $PU_L$, $PU_R$.

Different embodiments of a circuit that make it possible to apply a sequence of signals in order to carry out an initialisation of the type of that described hereinabove, are given in FIGS. 5 and 6.

Figure 5:
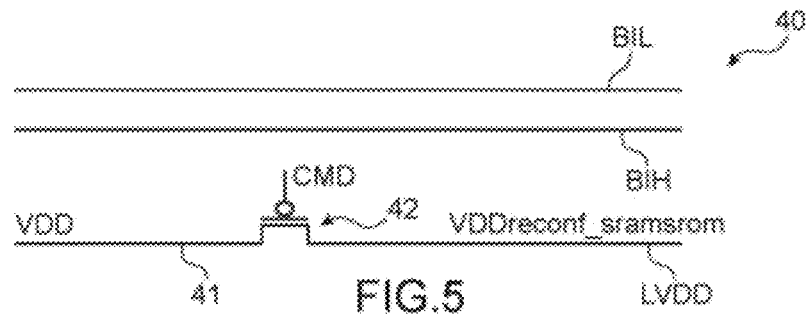
FIG. 5 is used to show an example of a circuit able to apply such a sequence of signals.

A first particular embodiment of circuit 40 shown in FIG. 5 comprises biasing lines BIL and BIH and a portion that makes it possible to carry out a delayed powering up of the supply line LVDD connected to the two inverters of the cell. A switching element controlled by a control signal CMD, is arranged between a first portion 41 and the first supply line LVDD.

The switching element is typically formed from at least one transistor 42 of which the gate receives a control signal CMD. During the first step of the initialisation sequence, the control signal CMD is in a state in such a way that the transistor 42 is blocked, with the first portion 41 and the supply line LVDD then not being connected. A change in the state of the control signal CMD makes it possible to connect the first portion 41 to the supply line LVDD, with the supply line receiving a power voltage VDD.

Figure 6:
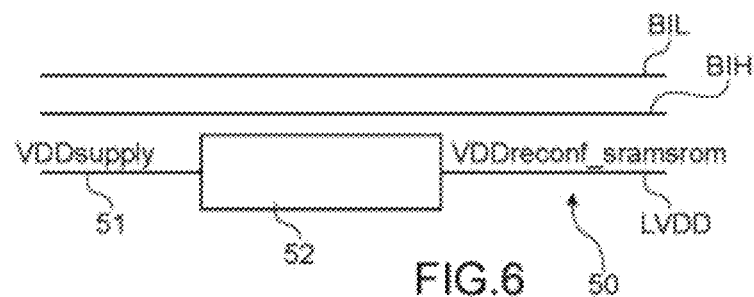
FIG. 6 gives another example of a circuit able to apply such a sequence of signals.

A second example of a circuit 50 is shown in FIG. 6. In addition to the biasing lines BIL and BIH, this circuit 50 comprises a portion 51 able to receive the power voltage VDD. A delay cell 52 is arranged between the portion 51 and the supply line LVDD.

A particular embodiment provides a memory cell provided with more than two transistors provided with a rear electrode connected to a biasing line.

Figure 7:
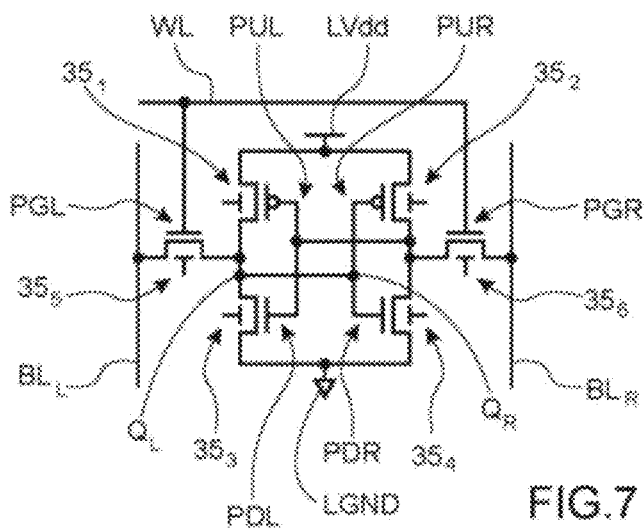
FIG. 7 gives an equivalent electrical diagram of a SRAM cell of which the transistors are provided with rear biasing electrodes, with the cell having a supply line of which the powering up is able to be delayed so as to allow it to be initialised at a predetermined pre-load value according to its connection in relation to the biasing lines then to be used as a conventional SRAM memory cell.

In the example shown in FIG. 7, the SRAM cell has a structure of the type commonly referred to as "6T" with 6 transistors, and in particular two load transistors $PU_L$, $PU_R$, in this example of the PMOS type, and two conduction transistors $PD_L$, $PD_R$, in this example of the NMOS type, creating the two inverters of the cell.

In this example of a cell, in addition to the two load transistors $PU_L$, $PU_R$, each provided with a rear electrode resp. $35_1$, $35_2$, with an arrangement similar to that described hereinabove, two conduction transistors $PD_L$, $PD_R$, are also provided with rear electrodes resp. $35_3$, $35_4$, making it possible to respectively modulate the threshold voltage of the conduction transistor $PD_L$, and of the other conduction transistor $PD_R$. Two access transistors $PG_L$, $PG_R$, are here also provided with rear electrodes resp. $35_5$, $35_6$.

This cell is also arranged in an upper stage of a 3D microelectronic device comprising several superimposed stages of transistors and is provided, as in a conventional SRAM cell structure, with two storage nodes $Q_L$, $Q_R$ provided to store a first logical information, and a second logical information complementary of the first information. The maintaining of the logical information in the nodes $Q_L$, $Q_R$ is provided by the transistors $PU_L$, $PU_R$, $PD_L$, $PD_R$ forming the inverters looped on themselves, i.e. mounted in antiparallel or head to tail.

Thus, a first inverter is provided with an input connected to the first node $Q_L$ of memorisation and to an output of another inverter, the first inverter furthermore having an output connected to the second node $Q_R$ and to an input of the other inverter. This other inverter is therefore provided with an input connected to the second storage node and with an output connected to the first storage node.

The load transistors $PU_L$, $PU_R$ are connected to a supply line LVDD such as mentioned hereinabove and which can itself be connected to one or the other of the circuits described hereinabove in liaison with FIGS. 5 and 6 or with a circuit that makes it possible to implement a delayed powering up of the supply line LVDD.

The access transistors $PG_L$, $PG_R$ are connected respectively to lines referred to as bit $BL_L$ and $SL_R$ generally shared by the SRAM cells of the same column of cells of an array map formed of cells arranged in lines (horizontal rows) and in columns (vertical rows). Access to the storage nodes $Q_L$, $Q_R$ is controlled by a word line WL generally shared by the SRAM cells of the same line (horizontal row) of cells of the array map. The access transistors $PG_L$, $PG_R$ are thus provided to allow for access or block access respectively to the first node $Q_L$, and to the second node $Q_R$.

Different cases of biasing of the respective rear electrodes $35_1$, $35_2$, $35_3$, $35_4$, $35_5$, $35_6$ of the transistors $PU_L$, $PU_R$, $PD_L$, $PD_R$, $PU_L$, $PU_R$ and which make it possible to carry out an initialisation with a ROM memory code such as described hereinabove are given hereinbelow, by way of example, in a table.

In this table, VNBB and VPBB correspond to biasing potentials by default able to be applied during the initialisation sequence to rear electrodes of transistors of the NMOS or PMOS type of the cell which are separate from the transistors on which the pair of direct biasing VFBB is applied, and of indirect biasing VRBB making it possible, as in the step 2 described hereinabove, to create a biasing imbalance in order to impose a logical data to the cell during this sequence.

These potentials VNBB and VPBB can be standard potentials that are usually used by the designers, and correspond for example respectively to a power voltage VDD and to a ground potential GND or inversely.

| BB | Case A | Case B | Case C | Case D | Case E | Case F |
|---|---|---|---|---|---|---|
| $35_1$ | VFBBp | VPBB | VPBB | VFBBp | VFBBp | VFBBp |
| $35_2$ | VRBBp | VPBB | VPBB | VRBBp | VRBBp | VRBBp |
| $35_3$ | VNBB | VRBBn | VRBBn | VRBBn | VRBBn | VRBBn |
| $35_4$ | VNBB | VFBBn | VFBBn | VFBBn | VFBBn | VFBBn |
| $35_5$ | VNBB | VNBB | VRBBn | VNBB | VRBBn | VRBBn |
| $35_6$ | VNBB | VNBB | VFBBn | VNBB | VFBBn | VRBBn |

In a first case (case A), the direct biasing VFBBp and indirect biasing VRBBp potentials, with VFBBp<VPBB<VRBBp, VPBB being a nominal potential are applied respectively on the rear electrode of a load transistor $PU_L$, and on the rear electrode of another load transistor $PU_R$, both of the same type, here of the PMOS type, in such a way as to obtain an imbalanced biasing between these transistors of the same type during the second step of the initialisation sequence, while the rear electrodes of the other transistors, here of the NMOS type are set to the same nominal potential VNBB.

In this first case, biasing imbalance is carried out only on two transistors. Only these two transistors make use of a rear biasing electrode.

According to a second case (case B), the biasing imbalance is implemented between the two conduction transistors, the direct biasing VFBBn and indirect biasing VRBBn potentials, with VRBBn<VNBB<VFBBn, VNBB being a nominal potential being applied respectively on the rear electrode of a conduction transistor $PD_L$ of the NMOS type, and on the other rear electrode of a conduction transistor $PD_R$ of the NMOS type.

A third case (case C) provides a biasing imbalance of a conduction transistor $PD_L$ of the NMOS type with respect to the other $PD_R$ as well as an access transistor $PA_L$ of the NMOS type with respect to the other $PA_R$.

In a fourth case (case D), the biasing imbalance is carried out between on the one hand the transistors $PD_L$, $PU_L$, $PA_L$ and on the other hand another side of the cell formed by the transistors $PD_R$, $PU_R$, $PA_R$ According to an embodiment of this fourth case, it is provided for example to apply the potentials VFBBp=−2V and VRBBp=2V respectively on the rear electrode of a load transistor $PU_L$, and on the rear electrode of the load transistor $PU_R$, here both of the PMOS type. In this example, for example the potentials VFBBn=2V and VRBBn=−2V are then applied respectively on the rear electrode of the transistor $PD_L$, and on the rear electrode of the conduction transistor $PD_R$, here both of the NMOS type. The nominal potential VNBB chosen can be for example 0V.

A fifth case (case E), the biasing imbalance is carried out between the transistors $PD_L$, $PU_L$, belonging to one side of the cell and on the other hand the transistors $PD_R$, $PU_R$, belonging to another side of the cell.

A sixth case (case F), provides a biasing imbalance of an inverter in relation to the other and a biasing specific to the same potential VRBB of the two access transistors during the first phase so as to reduce the leakage current.

In order to allow for the implementation of a biasing according to one or the other of the cases exposed hereinabove, it is possible to provide an arrangement of the cell such as in the example of a particular arrangement shown in FIG. 8A or in the other particular embodiment shown in FIG. 8B.

The transistors $PU_L$, $PU_R$, $PD_L$, $PD_R$, $PU_L$, $PU_R$ are located in a given level $N_k$ of a device comprising several levels of components with biasing lines $BIL_1$, $BIH_1$, $BIL_2$, $BIH_2$, $BIL_3$, $BIH_3$ able to convey the various biasing potentials to the rear electrodes of the transistors of the cells located under this level $N_k$.

If the case D of biasing of the table given hereinabove is taken,

The biasing lines $BIL_1$ and $BIL_3$ can be in particular those provided for conveying an indirect potential VRBBn, while the biasing line $BIL_2$ conveys an indirect potential VRBBp. The biasing lines $BIH_1$ and $BIH_3$, can be in particular provided to convey a direct potential VFBBn, while the biasing line $BIH_2$ conveys a direct potential VFBBp.

The way in which the rear electrodes (not shown in these figures) of the transistors $PU_L$, $PU_R$, $PD_L$, $PD_R$, $PU_L$, $PU_R$ are connected to the various biasing lines determines the logical information imposed on the cell during the initialisation sequence.

Figure 8A:
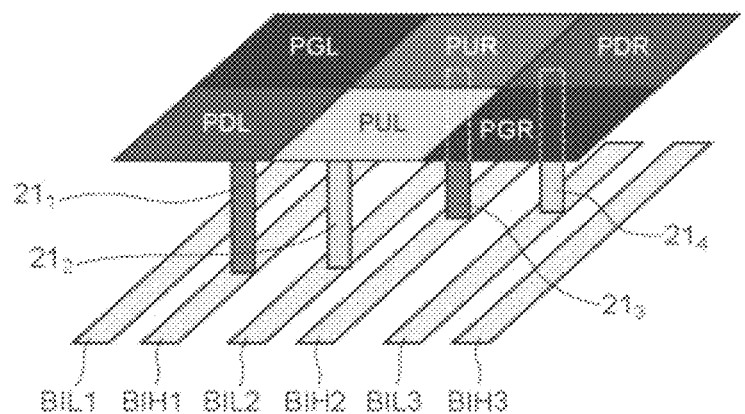
FIGS. 8A-8B are used to show various configurations of vias of connections to rear biasing electrodes of transistors of cells, with these separate configurations being provided according to the respective logical states that are sought to be imposed, during an initialisation sequence and outside of the conventional write process, to these separate memory cells.

For example, in FIG. 8A, the rear electrodes of the transistors $PD_L$, $PU_R$, are connected, by the intermediary of conducting vias $21_1$, $21_3$ respectively to the biasing lines $BIH_1$, $BIH_2$ able to respectively convey the direct biasing potential VFBBn, and the direct biasing potential VFBBp in particular during the second step of the initialisation sequence. The rear electrodes of the transistors $PU_L$, $PD_R$, are connected, by the intermediary of conducting vias $21_2$, $21_4$ respectively to the biasing lines $BIL_2$, $BIL_3$ able to respectively convey, during this same second step, the indirect biasing potential VRBBp (with VRBBp>VFBBp) and the potential VRBBn (with VRBBn<VFBBn). In this case, the first node $Q_L$ can be for example led to store a logical information or a logical level '1'.

Figure 8B:
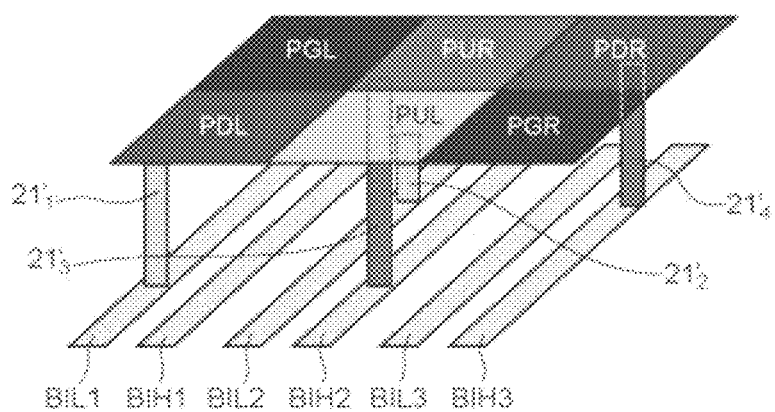

In FIG. 8B, corresponding to the case of biasing D mentioned hereinabove, the rear electrodes of the transistors $PD_L$, $PU_R$, of another cell are this time connected, by the intermediary of conducting vias $21'_1$, $21'_3$ respectively to the biasing lines $BIL_1$, $BIL_2$ able to respectively convey an indirect potential VRBBn and an indirect potential VRBBp, in particular during the second step of the initialisation sequence. The rear electrodes of the transistors $PU_L$, $PD_R$, are connected, by the intermediary of conducting vias $21'_2$, $21'_4$ respectively to the biasing lines $BIH_2$, $BIH_3$ able to respectively convey a direct biasing potential VFBBp (with VFBBp<VRBBp), and a direct biasing potential VFBBn (with VFBBn>VRBBn). In this case, the first node $Q_L$ of this other cell can be for example led to store a logical level '0'.

In order reduce the number of biasing lines, it can be provided, as an alternative to the embodiments of FIGS. 8A-8B, to implement a common biasing line between the rear electrode of an access transistor $PG_L$ and that of a neighbouring conduction transistor $PD_L$, as well as a common biasing line between the rear electrode of the other access transistor $PG_R$ and that of the other conduction transistor $PD_L$. Such a configuration can in particular make it possible to carry out the biasing cases C and E given hereinabove during the first phase of operation.

Another alternative provides to connect the rear electrode of the access transistors $PG_L$, $PG_R$ to a node or to a line dedicated to the application of a potential VRBB, in particular during a first phase of the initialisation sequence. Such an alternative configuration can make it possible to implement the biasing case F given hereinabove.

Figure 9:
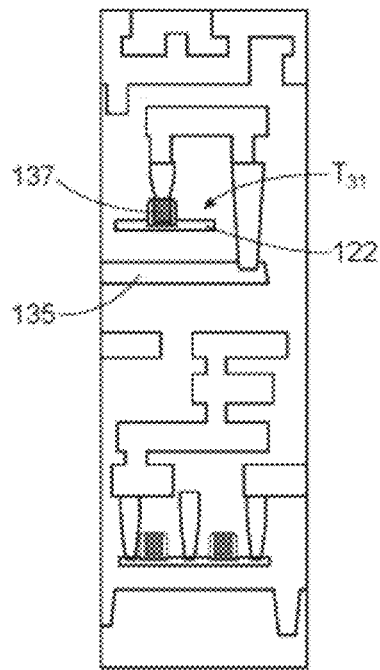
FIG. 9 is used to show a particular configuration of access transistors with a biasing electrode and a front gate connected together.

In order to reduce the number of biasing lines, it is also possible to provide access transistors $T_{31}$ that have an arrangement that uses the one shown in FIG. 9, with a rear electrode 135 coupled, as in the example of FIG. 1, by electrostatic coupling to a channel region 122, and connected this time to its gate electrode 137 located on the channel region 122.

Figure 10:
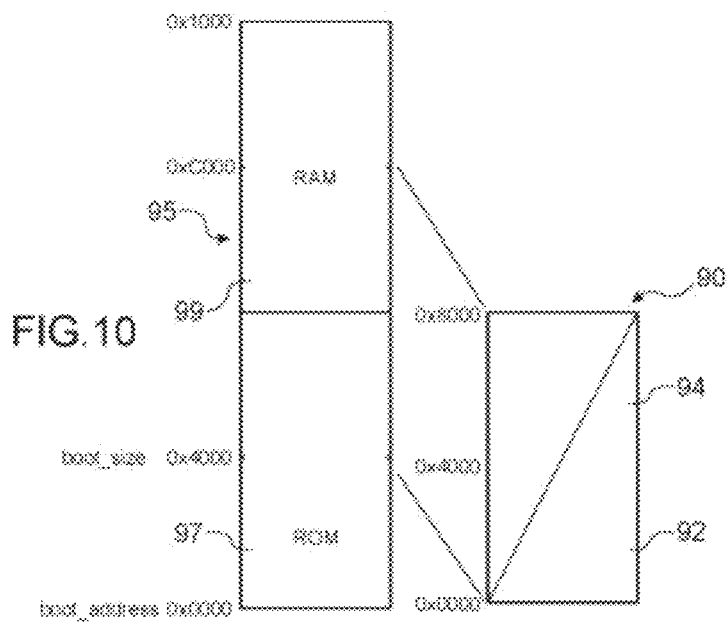
FIG. 10 is used to show the correspondence between a set of virtual addresses relative to a RAM memory and a ROM memory, and a physical memory according to a particular embodiment.

FIG. 10 diagrammatically shows a physical memory 90 which comprises a sector 92 able to carry out a RAM memory and a ROM memory. The sector 92 is thus formed from a set of cells that have an arrangement and a biasing such as described hereinabove, in particular in liaison with FIGS. 1 to 9.

The block 95 represents a set of virtual addresses seen from a processor or from a central processing unit, (CPU) led to use the data of the physical memory 90 and belonging to a digital processing system.

The processor may be led, during a first memory access, corresponding for example to an initialisation phase of the system, to use or read program data, in particular a boot program (BOOT) stored in the ROM portion of the physical memory 90 and corresponding to cells of the sector 92 to which the initialisation sequence described hereinabove was applied.

The processor can then be led, during a second memory access, to use the RAM memory data, corresponding to the same cells of the sector 92 maintained according to a balanced biasing of the biasing lines of the rear electrodes.

A differentiation between an access to the ROM memory and an access to the RAM memory can be produced by virtual address decoding during the receipt of a read/write access request. Said differentiation between access to the ROM memory and access to the RAM memory is operated using a virtual address management module for converting a virtual address into a physical address.

Figure 11A:
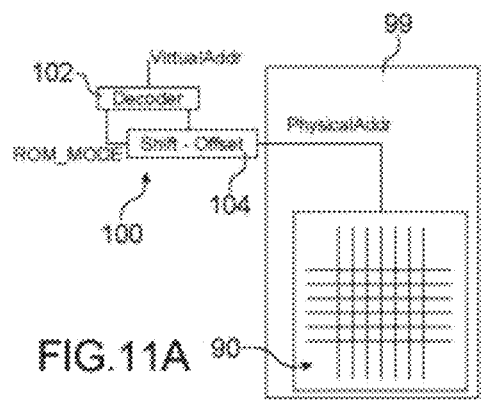
FIGS. 11A-11C give different embodiments of a module for converting a virtual memory address into a physical address.
Figure 11B:
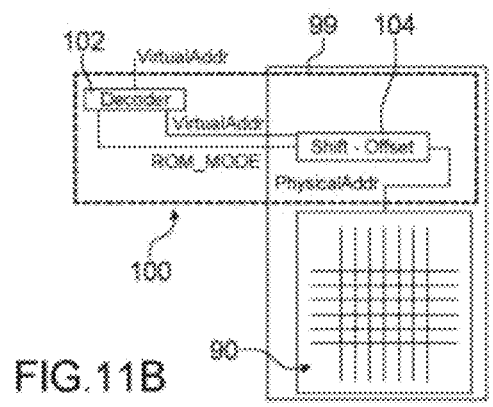
Figure 11C:
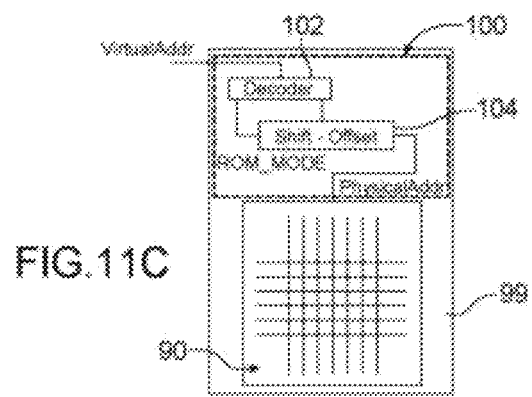

Various examples of an embodiment of a module 100 for converting a virtual address into a physical address are given in FIGS. 11A-11C.

These figures are used to respectively show:
a first case wherein the module 100 is fully dissociated from a support 99 on which the physical memory 90 is found,
a second case wherein the module 100 is partially located on the support 99 of the physical memory 90,
a third case wherein the module 100 is fully integrated on the same support 99 as the physical memory 90.

In the second case, the memory support 99 can comprise a specific pin to receive a ROM_MODE indicator signal of a memory access type produced on the physical memory between access to cells when they each contain a pre-loaded data during the initialisation phase or to cells that are in their conventional operating mode and are available for read and write access.

In the third case, the support 99 whereon the memory is can comprise a decoder 102, with this decoder 102 then typically having mapping information linked to the virtual memory 95 seen from the processor.

In the three cases, the module 100 is provided with a decoder 102 configured for, from a virtual address "VirtualAddr", emitting a memory access type ROM_MOD indicator signal between an access relative to the ROM memory and an access relative to the RAM memory. Said indicator signal is different depending on whether an access to the ROM memory or to the RAM memory is required. The decoder 102 may use for this a "boot_size" data related to the size of the space reserved for the ROM memory 97.

The decoder 102 is configured to transmit the memory access type indicator signal and transmit the virtual address to a shifter module 104 in charge of applying a so-called "shift" operation to the virtual address and consequently produce a physical address "PhysicalAddr" resulting from this operation.

A memory device such as described hereinabove can typically be used in a digital system, comprising a processor, for example a graphics processor or GPU (for "Graphics Processing Unit") or a digital signal processor (DSP) that uses the data of a ROM memory for the initialisation thereof. Once this data is used, the cells are reconfigured (biasing is standard SRAM memory mode) and can thus be reused.

A particular application of a memory device such as described hereinabove provides that the logical information stored by a set of cells when they are operating in ROM mode can form circuit identification information and in particular information of the PUF type (for "Physical Unclonable Function) in other words a unique identifier of an electronic device.

Thus, a circuit identification method wherein a code is read that corresponds to the pre-loaded ROM memory data consecutively to an initialisation sequence such as described hereinabove, and which depends for each cell on its arrangement with respect to the biasing lines BIL and BIH can be provided.

Although the invention advantageously applies to a memory cell 6T, i.e. with 6 transistors, the invention also applies to memory cells that contain less than 6 transistors, for example 4 transistors. In this case, each memory cell can comprise 2 NMOS transistors and 2 access transistors, and the differentiated rear biasing, i.e. the imbalance, is preferably applied to the access transistors that play the role of "pull-up" or load transistors. The invention can also apply to memory cells that contain more than 6 transistors, for example 8 or 10 transistors.

Furthermore, when the invention applied to cells 6T, the differentiated rear biasing can be applied only to the two transistors of type N or to the two transistors of type P forming the inverters. The effect is more significant when the imbalance is applied on the transistors forming the inverters of the memory cell rather than on the access transistors.

Finally, the expression "biasing line" here designates an electrically-conductive line that is intended for the application of an electrical biasing potential. They are used in particular to apply a biasing potential on the rear electrodes of the transistors. It should be noted that the biasing lines can be used in operating phases of the memory cells other than the initialisation phase, for example during the "stand-by" or holding phase.

The invention claimed is:

1. A microelectronic device provided with several superimposed layers of components and comprising:
a lower level provided with one or several components formed in at least one first semiconductive layer,
an upper layer comprising transistors having respective channel regions formed in at least one second semiconductor layer arranged above the first semiconductive layer,
a set of memory cells each provided with a first inverter and a second inverter cross-connected, the first inverter and the second inverter being connected to, and arranged between, a supply line and a ground line,
the first inverter and the second inverter respectively comprising at least one first transistor of a first type, N or P, and at least one second transistor of the first type N or P, belonging to said upper layer, each of said first and second transistors having a lower electrode located between the second semiconductor layer and the first semiconductive layer and coupled by capacitive coupling with a channel region located in the second semiconductor layer,
said memory cells of said set of memory cells being further connected to:
a first biasing line of one among the lower electrode of the first transistor and the lower electrode of the second transistor,
a second biasing line of the other among the lower electrode of the at least one first transistor and the lower electrode of the at least one second transistor,
wherein said set of memory cells belong to a row of cells, said row of cells comprising a first cell connected to said first biasing line and to said second biasing line by means of a first pair of vias, a second cell of said row of cells being connected to said first biasing line and to said second biasing line by means of a second pair of vias, the device further comprising a circuit configured to, during an initialisation sequence:

during a first phase, apply a first potential and a second potential different from the first potential, respectively on said first biasing line and said second biasing line, and apply a voltage between said supply line and the ground line, in such a way as to impose on each cell of said set of memory cells a logical data having a value depending on the first and second biasing lines to which the lower electrode of a first transistor of the respective cell and the lower electrode of a second transistor of the respective cell are respectively connected, then during a second phase, apply the same potential on the first biasing line and the second biasing line, and maintain a voltage between said supply line and the ground line, in such a way as to retain the logical data and render the cells of said set of memory cells available for read and write access.

2. The microelectronic device according to claim 1, wherein at least one first cell of said set of memory cells has a first transistor with a lower electrode which is connected to the first biasing line and has a second transistor with a lower electrode which is connected to the second biasing line, at least one second cell of said set of memory cells has a first transistor with a lower electrode which is connected to the second biasing line and having a second transistor with a lower electrode which is connected to the first biasing line, in such a way that during said initialisation sequence, a first logical data is imposed on the first cell, and a second logical data, complementary to the first logical data, is imposed on the second cell.

3. The microelectronic device according to claim 1, wherein the cells of said set of memory cells respectively comprise at least one third transistor and at least one fourth transistor, with the third transistor and the fourth transistor being of a second type, P or N, opposite the first type, the third transistor and the fourth transistor of each cell of the set of memory cells belonging to said upper layer and each having a lower electrode located between the second semiconductor layer and the first semiconductive layer and coupled by capacitive coupling with a channel region located in the second semiconductor layer, said cells of said set of memory cells being connected to:
at least one third biasing line connected to one among the lower electrode of the third transistor and the lower electrode of the fourth transistor,
at least one fourth biasing line connected to the other among the lower electrode of the third transistor and the lower electrode of the fourth transistor.

4. The microelectronic device according to claim 3, said circuit being configured during said first phase of the initialisation sequence to:

apply a pair of different potentials, respectively on said third biasing line and said fourth biasing line, then during the second phase apply the same potential on the third biasing line and the fourth biasing line.

5. The microelectronic device according to claim 1, wherein the first transistor and the second transistor, are:
respectively, a first load transistor and a second load transistor of type P, or
respectively, a first conduction transistor and a second conduction transistor of type N.

6. The microelectronic device according to claim 5, wherein wherein the first transistor and the second transistor are respectively, a first load transistor and a second load transistor of the type P, the cells of said set of memory cells each including a first conduction transistor having a gate connected to a gate of the first load transistor and including a second conduction transistor having a gate connected to a gate of the second load transistor, with the first and second conduction transistors including respective lower electrodes coupled by capacitive coupling with a channel region, the lower electrodes respectively of said first conduction transistor and of said second conduction transistor being set to the same potential during the first phase of the initialisation sequence or being set respectively to a third potential and to a fourth potential, or wherein the first transistor and the second transistor are respectively, a first conduction transistor and a second conduction transistor of the type N, the cells of said set of memory cells each including a first load transistor having a gate connected to a gate of the first conduction transistor and including a second load transistor having a gate connected to a gate of the second conduction transistor, with the first and second conduction transistors including respective lower electrodes coupled by capacitive coupling with a channel region, the lower electrodes respectively of said first load transistor and of said second load transistor being, during the first phase of the initialisation sequence, set to the same potential or being set respectively to a third potential and to a fourth potential.

7. The microelectronic device according to claim 6, wherein said cells of said set of memory cells are further provided with a first access transistor to a first node and with a second access transistor to a second node, with the first access transistor and the second access transistor each being provided with respective lower electrodes located between the second semiconductor layer and the first semiconductive layer and coupled by capacitive coupling with a channel region located in the second semiconductor layer.

8. The microelectronic device according to claim 7, wherein the first and second access transistors are of the same type as the first transistor and the second transistor, with the lower electrodes respectively of said first access transistor and of said second access transistor being, during the first phase of the initialisation sequence, set to the same potential or being set respectively to the first potential and to the second potential.

9. The microelectronic device according to claim 1, wherein said circuit is further configured to carry; out a delayed powering up of the supply line during the first phase, the circuit further comprises:
a switching element arranged between a circuit portion configured to receive a power voltage VDD and the supply line, with the switching element being configured to disconnect then connect the circuit portion to the supply line in response to a change of state in a first control signal, the circuit being further configured to,
during a first state of the first phase, disconnect the circuit portion from the supply line, then
after the first state and during a second state of the first phase, connect the circuit portion to the supply line.

10. The microelectronic device according to claim 1, wherein said circuit is further configured to carry out a delayed powering up of the supply line during the first phase, the circuit further comprises:
a circuit portion configured to receive a power voltage VDD and
at least one delay cell, the delay cell being arranged between said circuit portion and said supply line.

11. The microelectronic device according to claim 1, further comprising a memory device including the set of memory cells,
the memory device further comprising a conversion module for converting a virtual memory address into a physical memory address, said conversion module including a decoder configured to:
using a virtual address, produce an indicator signal of a first type of access to data pre-loaded into said set of memory cells during said initialisation sequence or produce an indicator signal of a second type of access to data written in said set of memory cells after said initialisation sequence and transmit the virtual address to a shifter module, with the shifter module being configured to apply a shift operation to the virtual address to produce a physical address.

* * * * *